(12) United States Patent
Rhee et al.

(10) Patent No.: US 7,087,271 B2
(45) Date of Patent: Aug. 8, 2006

(54) METHOD FOR PREPARING LOW DIELECTRIC FILMS

(75) Inventors: Shi-Woo Rhee, Kyungsangbuk-do (KR); Sang-Ki Kwak, Kyungsangbuk-do (KR)

(73) Assignee: Postech Foundation (KR)

( * ) Notice: Subject to any disclaimer, the term of this patent is extended or adjusted under 35 U.S.C. 154(b) by 216 days.

(21) Appl. No.: 10/480,770

(22) PCT Filed: Jun. 28, 2002

(86) PCT No.: PCT/KR02/01238

§ 371 (c)(1),
(2), (4) Date: Dec. 12, 2003

(87) PCT Pub. No.: WO03/005429

PCT Pub. Date: Jan. 16, 2003

(65) Prior Publication Data

US 2004/0166240 A1  Aug. 26, 2004

(30) Foreign Application Priority Data

Jun. 29, 2001 (KR) .............................. 2001-38050

(51) Int. Cl.
*H05H 1/24* (2006.01)

(52) U.S. Cl. ...................... 427/577; 427/578; 427/579; 438/772; 438/778; 438/786

(58) Field of Classification Search ............... 427/569, 427/576, 577, 578, 579; 438/778, 773, 786
See application file for complete search history.

(56) References Cited

U.S. PATENT DOCUMENTS

| | | | | |
|---|---|---|---|---|
| 5,530,581 A | * | 6/1996 | Cogan | 359/265 |
| 6,077,574 A | | 6/2000 | Usami | |
| 6,147,009 A | | 11/2000 | Grill et al. | |
| 6,159,871 A | * | 12/2000 | Loboda et al. | 438/786 |
| 6,593,248 B1 | * | 7/2003 | Loboda et al. | 438/758 |
| 6,753,258 B1 | * | 6/2004 | Gaillard et al. | 438/691 |
| 6,772,710 B1 | * | 8/2004 | Lee | 118/723 HC |
| 2004/0197474 A1 | * | 10/2004 | Vrtis et al. | 427/255.28 |

FOREIGN PATENT DOCUMENTS

| | | |
|---|---|---|
| EP | 0 960 958 A2 | 1/1999 |
| WO | WO 99/41423 | 8/1999 |

OTHER PUBLICATIONS

Korean Patent Application Abstracts, Publication No. 1998-019144, Jun. 5, 1998, pp. 1-27.
Korean Patent Application Abstracts, Publication No. 2000-0068308, Nov. 11, 2001, pp. 1-13.

* cited by examiner

*Primary Examiner*—Bret Chen
(74) *Attorney, Agent, or Firm*—Anderson Kill & Olick, PC

(57) ABSTRACT

A low dielectric constant hydrogenated silicon-oxycarbide (SiCO:H) film is prepared by bringing an organosilicon or organosilicate compound having at least one vinyl or ethynyl group, or a mixture of a saturated organosilicon or organosilicate compound and an unsaturated hydrocarbon into contact with a substrate in the presence of an $O_2$-containing gas plasma.

5 Claims, 20 Drawing Sheets

METHOD FOR PREPARING LOW DIELECTRIC FILMS

FIELD OF THE INVENTION

The present invention relates to an improved plasma chemical vapor deposition (CVD) method for preparing a low dielectric constant hydrogenated silicon-oxycarbide (SiCO:H) film.

BACKGROUND OF THE INVENTION

With ever decreasing size of electronic devices utilized in ULSI (ultra-large-scale integrated) circuits, there has emerged the problem of increased capacitance of intralayers and/or interlayers, causing signal delays. Therefore, there has been a need to develop a low dielectric constant (k) material having a k-value lower than that of the conventional silicon dioxide ($SiO_2$) or fluorinated silicon oxide (SiOF).

U.S. Pat. No. 6,147,009 discloses a low dielectric constant material produced by reacting the vapor of a precursor containing atoms of Si, C, O and H in a parallel plate plasma enhanced chemical vapor deposition chamber, the precursor being a molecule with a ring structure such as 1,3,5,7-tetramethylcyclotetrasiloxane(TMCTS, $C_4H_{16}O_4Si_4$), tetraethylcyclotetrasiloxane($C_8H_{24}O_4Si_4$) or decamethylcyclopentasiloxane($C_{10}H_{30}O_5Si_5$), with or without added oxygen. However, the dielectric constant of the disclosed film is still high, in the range of 3.3 to 4.0. To further reduce the dielectric constant of the material described in the patent, U.S. Pat. No. 6,312,793 proposes a low k material consisting of two or more phases. However, the multi-phase material still has a k-value of more than 3.2.

Accordingly, the present inventors have endeavored to develop a novel material having a dielectric constant lower than those of conventional materials.

SUMMARY OF THE INVENTION

It is, therefore, an object of the present invention to provide a method for preparing an improved low dielectric constant hydrogenated silicon-oxycarbide (SiCO:H) film using a chemical vapor deposition (CVD) technique.

It is another object of the present invention to provide a SiCOH film having a dielectric constant (k) lower than those of conventional low dielectric materials.

In accordance with one aspect of the present invention, there is provided a method for preparing a low dielectric constant hydrogenated silicon-oxycarbide (SiCO:H) film which comprises conducting chemical vapor deposition using, together with an $O_2$-containing gas plasma, an organosilicon or organosilicate compound having at least one vinyl or ethinyl group, or a mixture of a saturated organosilicon or organosilicate compound and an unsaturated hydrocarbon.

In accordance with another aspect of the present invention, there is provided a low dielectric constant SiCOH thin film having a dielectric constant (k) of 2.6 or below, prepared by said method.

BRIEF DESCRIPTION OF THE DRAWINGS

The above and other objects and features of the present invention will become apparent from the following description thereof, when taken in conjunction with the accompanying drawings which respectively show.

DETAILED DESCRIPTION OF THE INVENTION

The present invention provides a method for preparing a low dielectric constant hydrogenated silicon-oxycarbide (SiCO:H) film by way of conducting chemical vapor deposition using, together with an $O_2$-containing gas plasma, an organosilicon or organosilicate compound having at least one vinyl or ethinyl group, or a mixture of a saturated organosilicon or organosilicate compound and an unsaturated hydrocarbon.

In accordance with the present invention, the process for forming a low dielectric constant SiCOH film may be conducted using a plasma CVD apparatus, e.g., a remote plasma CVD or a direct plasma CVD apparatus.

Figure 1A:
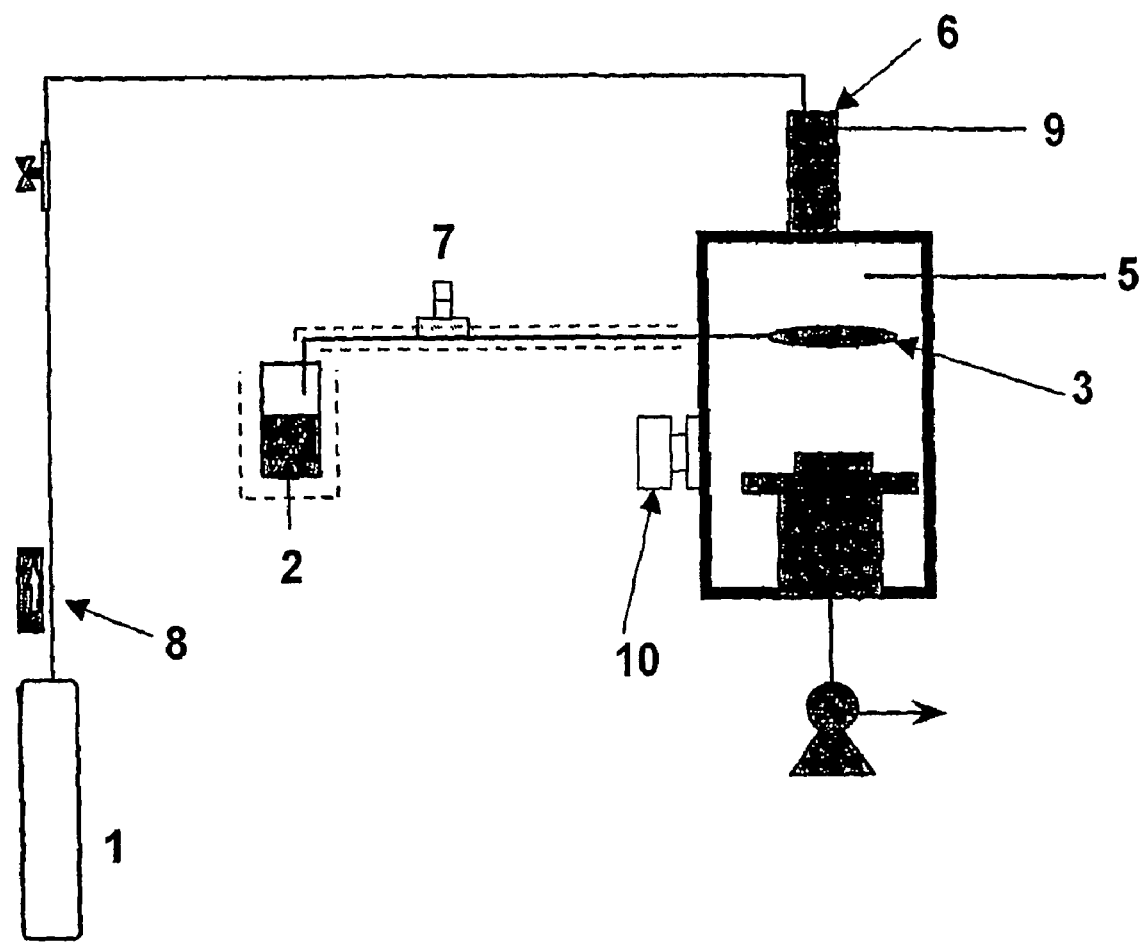
FIGS. 1a and 1b: schematic diagrams of the plasma reactor used in forming a thin film in accordance with the present invention.

The remote plasma CVD apparatus shown in FIG. 1*a* comprises a quartz tube (6), an antenna (9), a matching box (5), a high-frequency electric power source (10), a mass flow controller (7) for feeding a silicon precursor, a precursor container (2), and a mass flow controller (8) for feeding a reactive gas. The antenna is wound around the outer periphery of the quartz tube (6), to thereby connect the antenna (9) and the matching box (5), which is connected to the high-frequency electric power source (10). The quartz tube (6) is connected to the mass flow controller (8) for feeding an $O_2$-containing gas via a tube. In the remote plasma CVD apparatus, the $O_2$-containing gas and the silicon precursor are fed to the matching box (5) separately, the precursor being led through a diffusion ring (3). Further, in the direct plasma CVD apparatus shown in FIG. 1*b*, the silicon precursor fed from the precursor container (2) and the $O_2$-containing gas fed from a reactive gas container (1) are mixed, and then supplied to the matching box (5).

In accordance with a preferred embodiment of the present invention, there is provided a method for preparing a low dielectric constant SiCOH material, which comprises conducting chemical vapor deposition using an unsaturated organosilicon or organosilicate compound having at least one vinyl or ethinyl group and an $O_2$-containing gas plasma.

Representative examples of the unsaturated organosilicon or organosilicate compound having at least one vinyl or ethinyl group include vinyltrimethylsilane, vinyltriethylsilane, vinyltrimethoxylsilane, vinyltriethoxylsilane, 1,3,5-trivinyl-1,3,5-trimethylcyclotrisiloxane, 1,3,5,7-tetravinyl-1,3,5,7-tetramethylcyclotetrasiloxane, 1,3-divinyltetramethyldisiloxane, hexavinyldisiloxane, allyldimethylsilane, allyldimethoxysilane, ethinyltrimethylsilane, ethinyltriethylsilane and a mixture thereof.

The unsaturated organosilicon or organosilicate compound may be generated in situ, using an organosilicon or organosilicate having one or more halogen substituents.

In another preferred embodiment of the present invention, there is provided a method for preparing a low dielectric constant SiCOH material, which comprises conducting chemical vapor deposition using a mixture of a saturated organosilicon or organosilicate compound and an unsaturated hydrocarbon with an $O_2$-containing gas plasma. The mixing ratio of the saturated organosilicon or organosilicate compound and the unsaturated hydrocarbon is preferably in the range from 1:0.1 to 1:10. If the mixing ratio is less than 0.1, the dielectric constant of the film becomes too high, while the physical properties of the film become unsatisfactory if the ratio is above 10.

In the above embodiment, the saturated organosilicon or organosilicate compound, or the unsaturated hydrocarbon may have one or more halogen substituents.

Representative examples of the saturated organosilicon or organosilicate compound include trimethylsilane, triethylsilane, trimethoxysilane, triethoxysilane, tetramethylsilane, tetraethylsilane, tetramethoxysilane, tetraethoxysilane, hexamethylcyclotrisiloxane, tetramethylcyclotetrasiloxane, tetraethylcyclotetrasiloxane, octamethylcyclotetrasiloxane, hexamethyldisiloxane, bistrimethylsilylmethane and a mixture thereof.

Representative examples of the unsaturated hydrocarbon are $H_2C=CH_2$, $F_2C=CF_2$, $H_2C=CF_2$, $HFC=CFH$, $F_2C=C=CF_2$, $H_2C=C=CF_2$, $HFC=C=CFH$, $HC \equiv CH$, $FC \equiv CH$, $FC \equiv CF$, $Cl_2C=CCl_2$, $H_2C=CCl_2$, $HClC=CClH$, $Cl_2C=C=CCl_2$, $H_2C=C=CCl_2$, $HClC=C=CClH$, $ClC \equiv CH$, $ClC \equiv CCl$, $Br_2C=CBr_2$, $H_2C=CBr_2$, $HBrC=CBrH$, $Br_2C=C=CBr_2$, $H_2C=C=CBr_2$, $HBrC=C=CBrH$, $BrC \equiv CH$, $BrC \equiv CBr$, $I_2C=CI_2$, $H_2C=CI_2$, $HIC=CIH$, $I_2C=C=CI_2$, $H_2C=C=CI_2$, $HIC=C=CIH$, $IC \equiv CH$ and $IC \equiv CI$; and preferred is $H_2C=CH_2$ or $F_2C=CF_2$.

The $O_2$-containing gas which may be used in the present invention is selected from the group consisting of $O_2$, $N_2O$, $O_3$, $H_2O_2$, $CO_2$, $H_2O$ and a mixture thereof.

The method of the present invention may further comprise the step of annealing the deposited film, which may be carried out at a temperature ranging from 100 to 800° C. for a period ranging from 0.5 to 8 hrs, preferably at 450° C. for 1 hr, to obtain a thermally stable low dielectric constant SiCOH film. The annealing step may also include a rapid-thermal processing, which may be conducted at a temperature ranging from 100 to 900° C. for about 1 minute and a spike-heating step performed for 10 seconds.

Such low dielectric constant SiCOH material prepared in accordance with the method of the present invention has a dielectric constant (k) of 2.8 or below; and, further, the thermally stable SiCOH film formed after annealing has an exceptionally low dielectric constant (k) in the range of 1.6 to 2.6, the dielectric constant (k) being controllable by adjusting the process variables.

The present invention is further described and illustrated in Examples provided below, which are, however, not intended to limit the scope of the present invention.

EXAMPLE 1

Figure 1B:
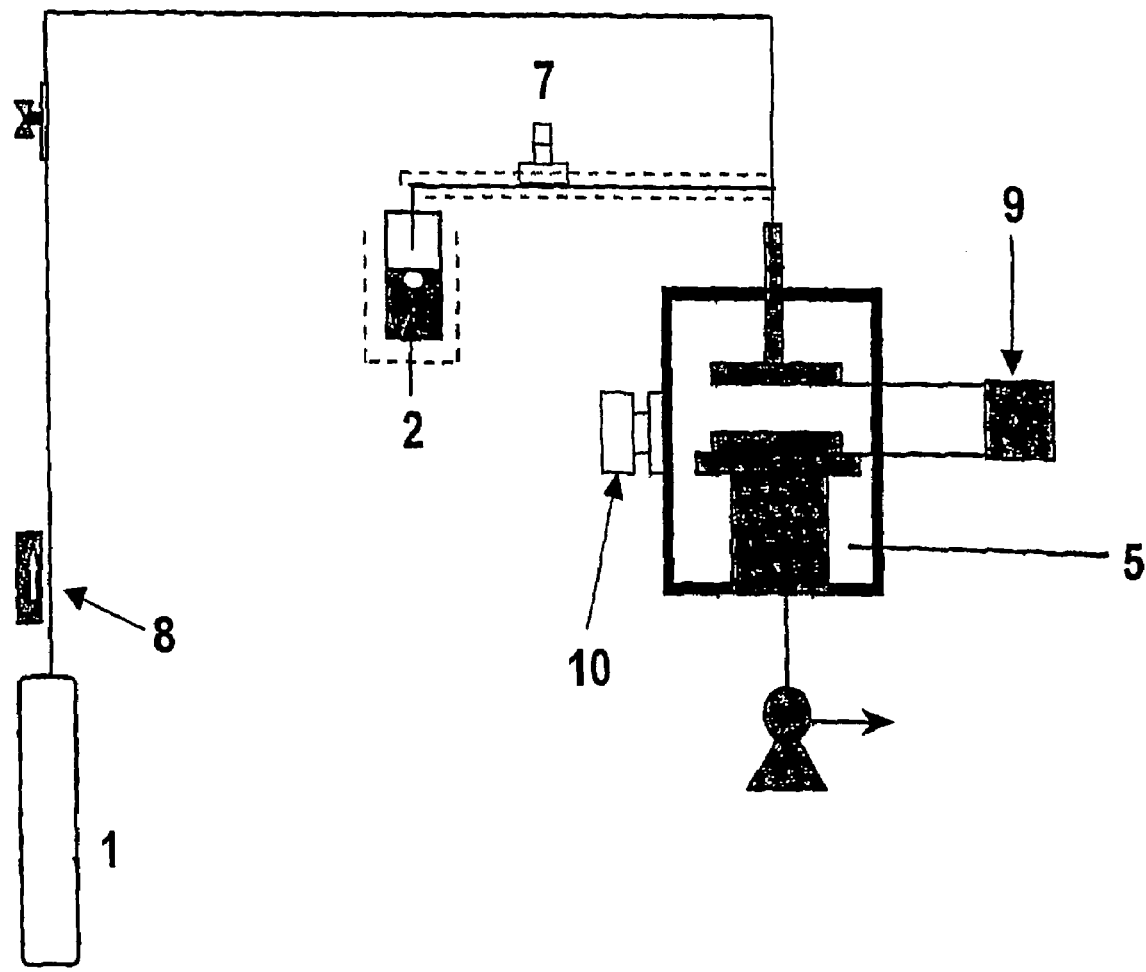

A SiCOH film was deposited on a Pt substrate using vinyltrimethylsilane (VTMS, $SiC_5H_{12}$) and $O_2$ in the direct plasma apparatus shown in FIG. 1*b*. The flow ratio of $O_2$/VTMS was varied in the range of 1 to 13.3 during the film deposition. The pressure and temperature in the reactor were 1 mmHg and 30° C., respectively, and the applied plasma power, 60W. The film so deposited was annealed under an Ar atmosphere at a temperature in the range of 300 to 500° C., to obtain a low dielectric constant film.

Figure 2:
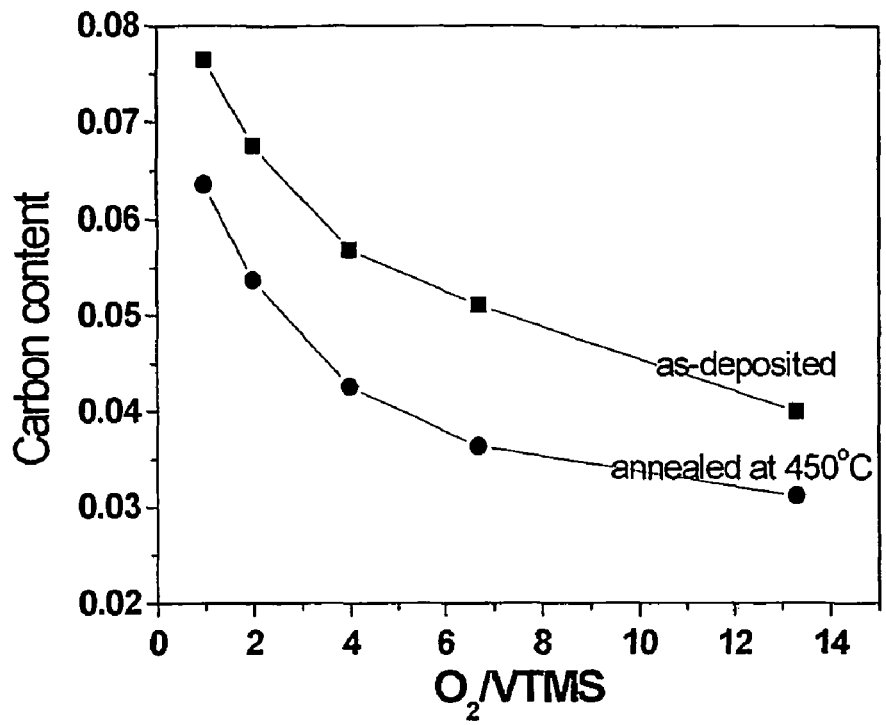
FIG. 2: variations in carbon contents of the film obtained in Example 1 of the present invention with $O_2$/VTMS flow ratio, respectively.
Figure 3:
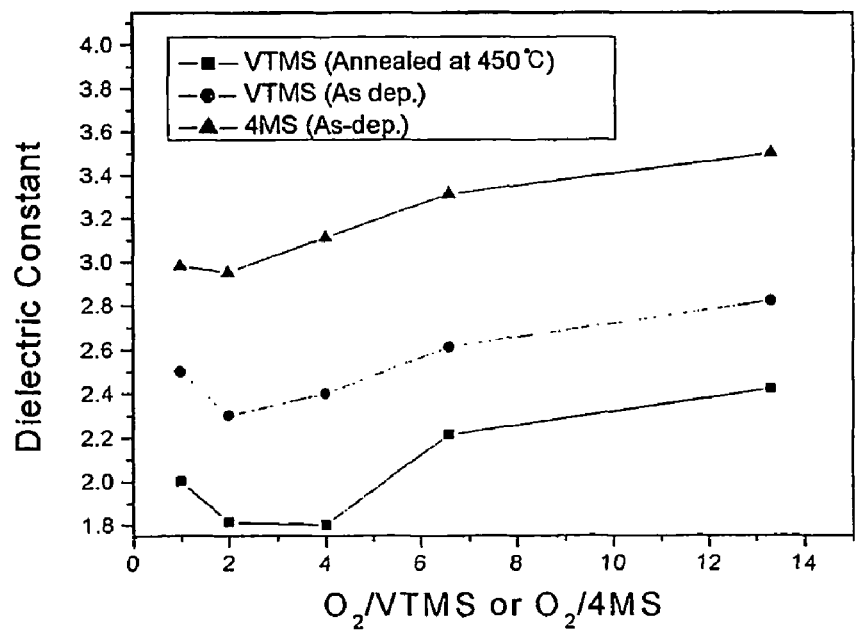
FIG. 3: variations in dielectric constants of the films obtained in Example 1 and Comparative Example 1 of the present invention with $O_2$/VTMS and $O_2$/4MS flow ratio, respectively.
Figure 4:
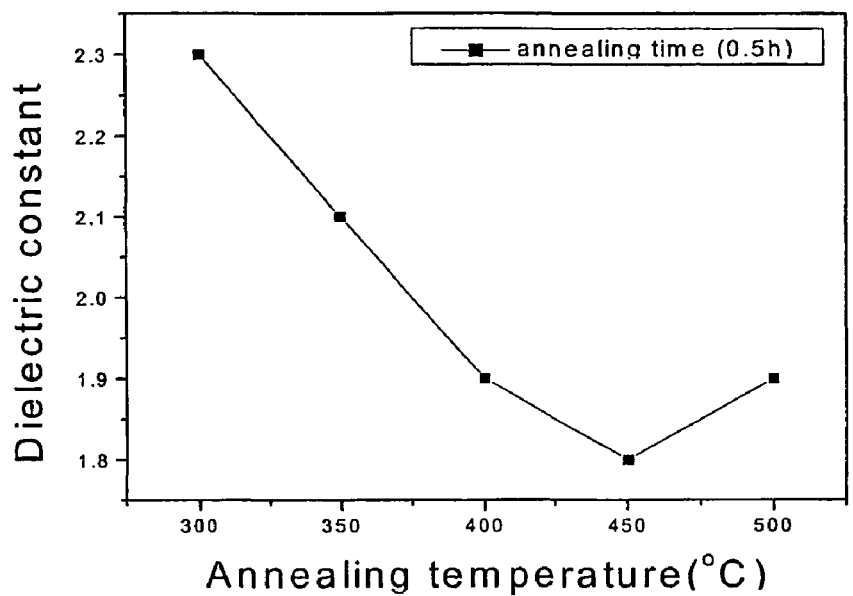
FIGS. 4 and 5: changes in the dielectric constant of the film obtained in Example 1 as function of annealing temperature and annealing time, respectively.
Figure 5:
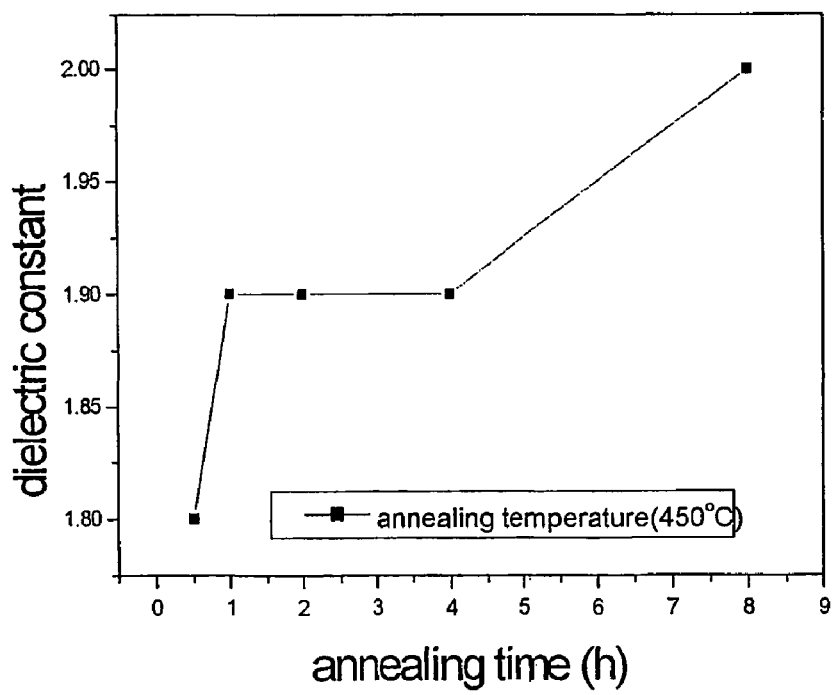

As shown in FIG. 2, the respective carbon contents of the deposited film and the film annealed at 450° C. become lower with the increasing flow ratio of $O_2$/VTMS. FIG. 3 exhibits that the annealed film at 450° C. has a dielectric constant ranging from 1.8 to 2.4, while the deposited film without the annealing has a dielectric constant ranging from 2.3 to 2.8. FIGS. 4 and 5 show the changes in the dielectric constant of the film obtained in Example 1 with the changes in the annealing temperature and annealing time at the $O_2$/VTMS flow ratio of 2, respectively.

Comparative Example 1

The procedure of Example 1 was repeated using tetramethylsilane(4MS, $SiC_4H_{12}$) in place of VTMS, to obtain a deposited film. As shown in FIG. 3, the film thus obtained has a dielectric constant ranging from 3.0 to 3.5, which is higher than that of the deposited film obtained in Example 1.

EXAMPLE 2

Except that a mixture of tetramethylsilane(4MS, $SiC_4H_{12}$) and $C_2F_4$ (1:1) was used instead of VTMS, the procedure of Example 1 was repeated to obtain a deposited film, which was subsequently annealed.

Figure 6:
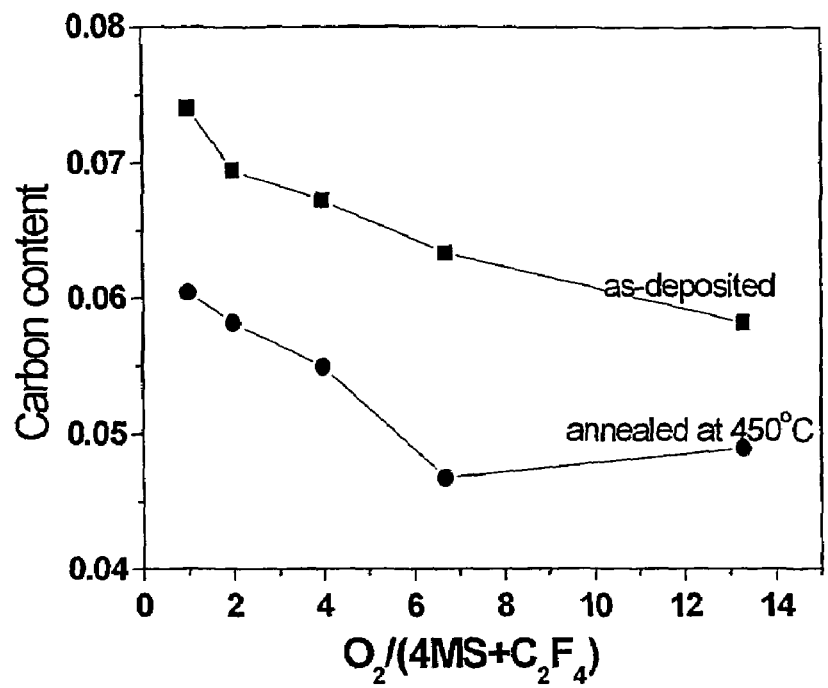
FIGS. 6 and 7: variations in carbon contents and dielectric constants of the film obtained in Example 2 of the present invention with $O_2$/(4MS+$C_2F_4$) flow ratio, respectively.
Figure 7:
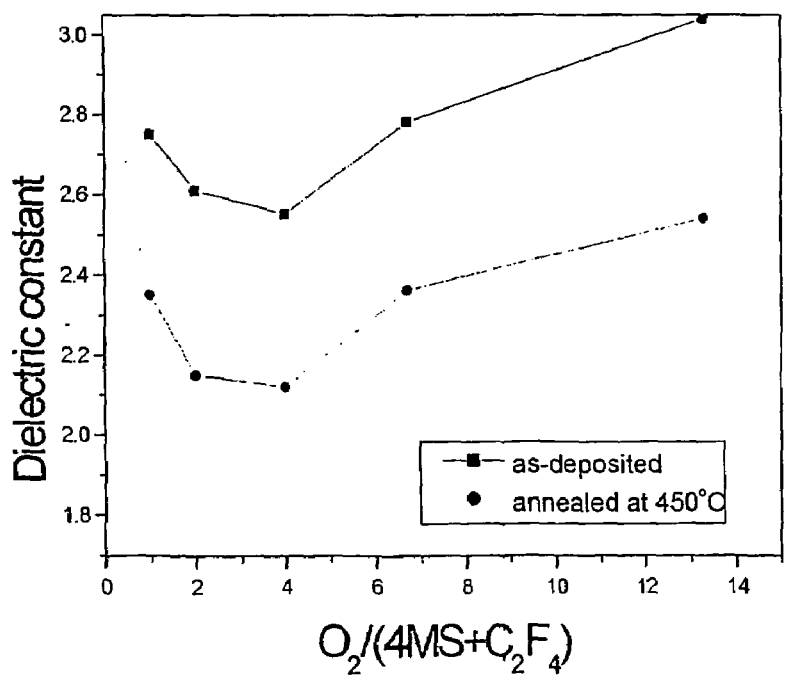
Figure 8:
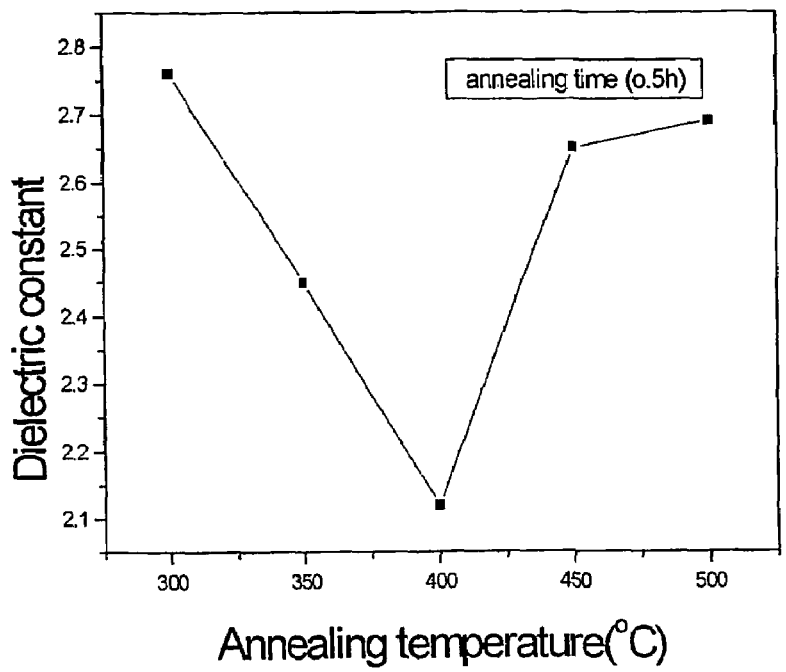
FIGS. 8 and 9: changes in the dielectric constant of the film obtained in Example 2 as function of annealing temperature and annealing time, respectively.
Figure 9:
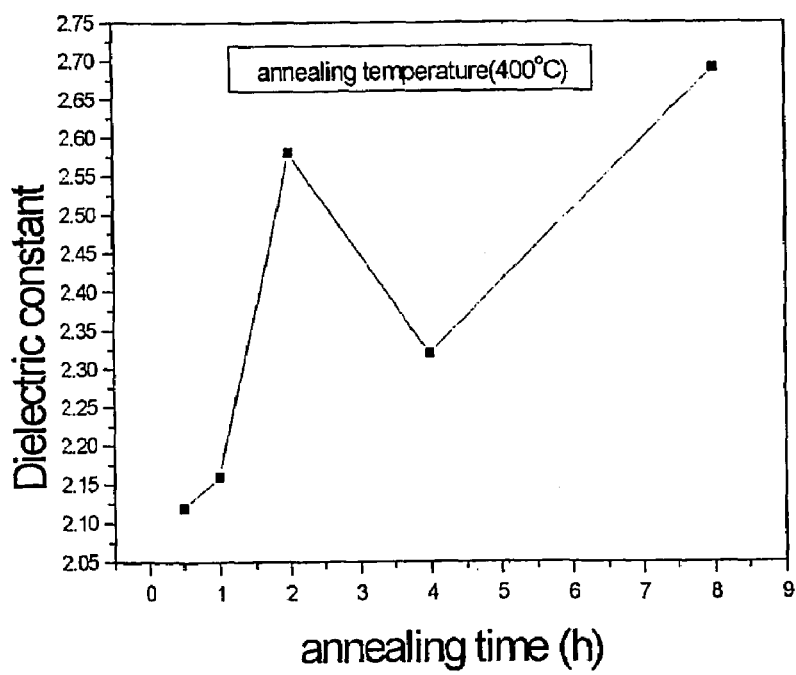

FIG. 6 and FIG. 7 show the carbon contents and dielectric constants of the deposited film and the annealed film, respectively. The deposited film has a dielectric constant of 3.0 or below, and the film annealed at 450° C. has a dielectric constant of 2.5 or below. FIG. 8 and FIG. 9 show the effects of the annealing temperature (annealing time=0.5 hr) and annealing time (annealing temperature=400° C.) at the $O_2$/(4MS+$C_2F_4$) flow ratio of 4 on the dielectric constant of the film, respectively. The film annealed at 300 to 500° C. for 0.5 hr has a dielectric constant of 2.75 or below.

EXAMPLE 3

The procedure of Example 1 was repeated using tetravinyltetramethylcyclotetrasiloxaneC (TVMCTSO, $Si_4O_4C_{12}H_{24}$) in place of VTMS, to obtain a deposited film which was subsequently annealed.

Figure 10:
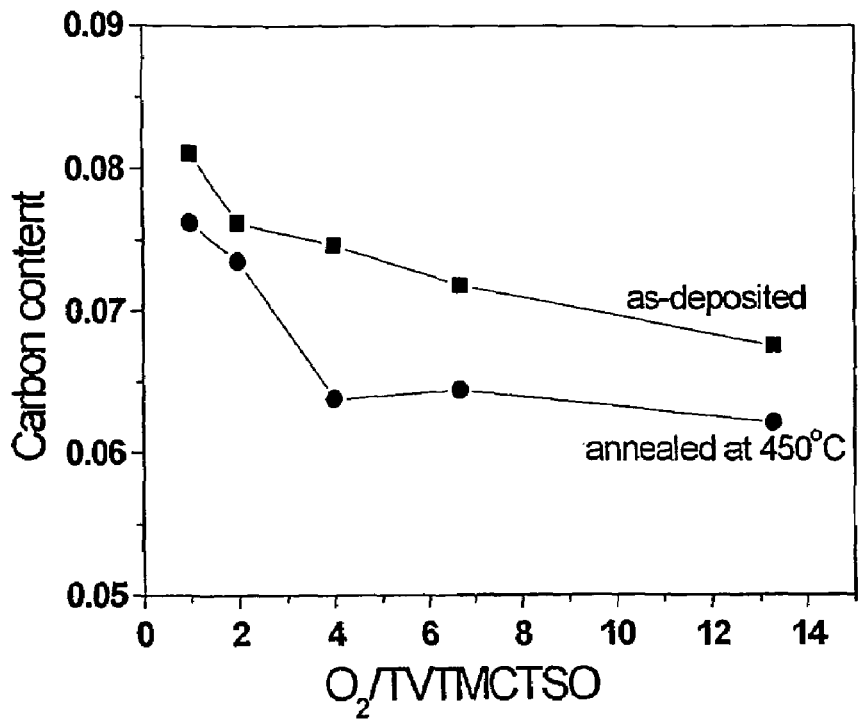
FIG. 10: variations in carbon contents of the film obtained in Example 3 of the present invention with $O_2$/TVTMCTSO flow ratio, respectively.
Figure 11:
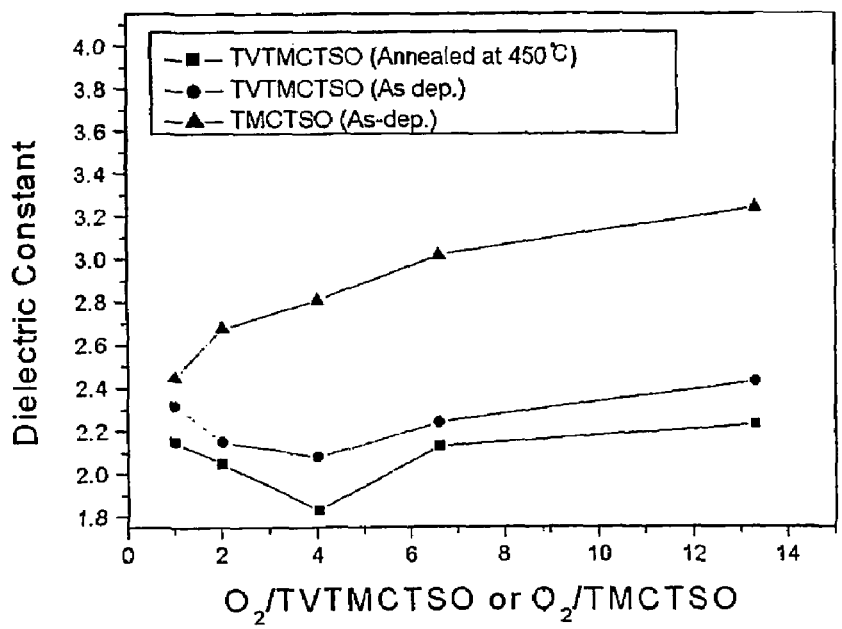
FIG. 11: variations in dielectric constants of the films obtained in Example 3 and Comparative Example 2 of the present invention with $O_2$/TVTMCTSO and $O_2$/TMCTSO flow ratio, respectively.
Figure 12:
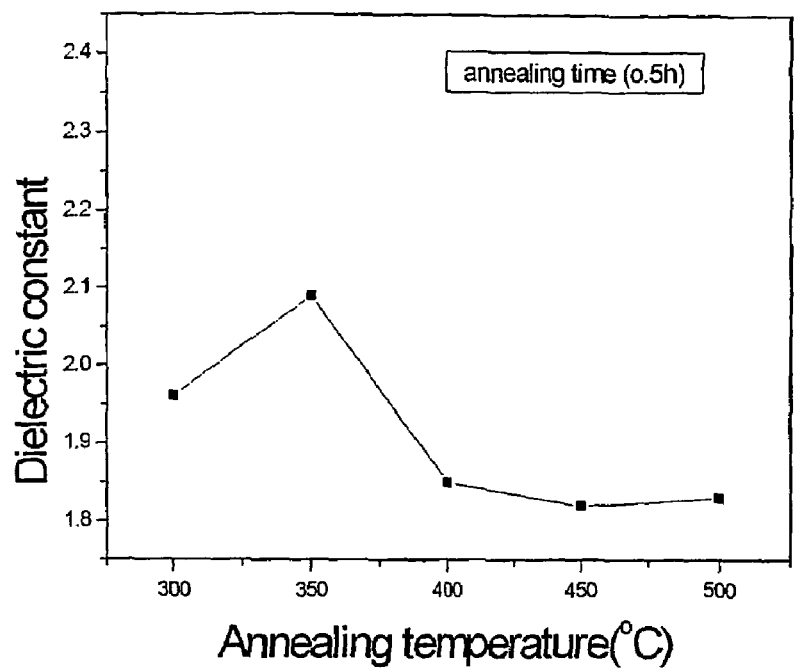
FIGS. 12 and 13: changes in the dielectric constant of the film obtained in Example 3 as function of annealing temperature and annealing time, respectively.
Figure 13:
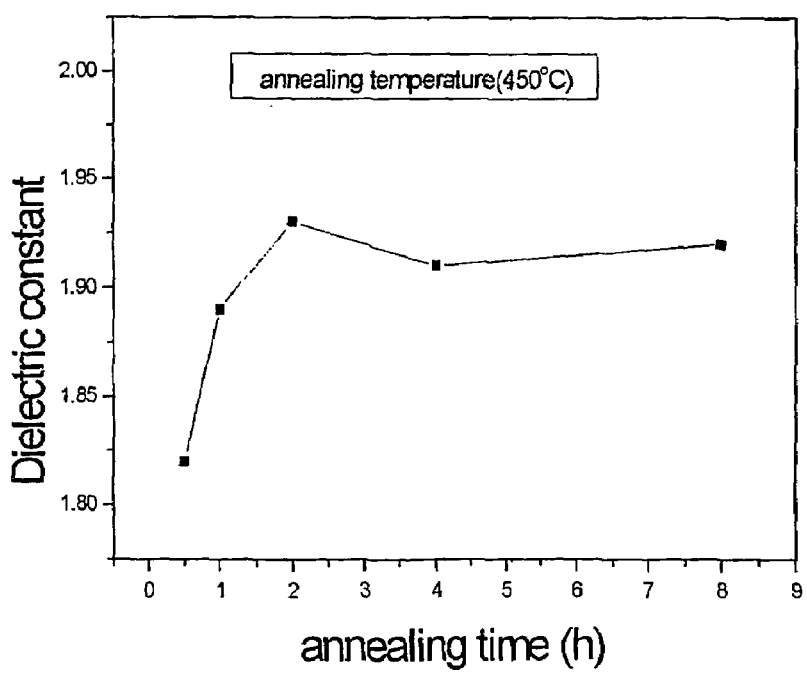

FIG. 10 and FIG. 11 show the carbon contents and dielectric constants of the deposited film and the annealed film, respectively. The deposited film has a dielectric constant of 2.4 or below, and the film annealed at 450° C., a dielectric constant of 2.2 or below. FIG. 12 and FIG. 13 show the effects of the annealing temperature (annealing time=0.5 hr) and annealing time (annealing temperature=450° C.) at the $O_2$/TVTMCTSO flow ratio of 4 on the dielectric constant of the film, respectively. The film annealed at 300 to 500° C. for 0.5 hr has a dielectric constant of 2.1 or below.

COMPARATIVE EXAMPLE 2

The procedure of Example 1 was repeated using tetramethylcyclotetrasiloxane (TMCTSO, $Si_4O_4C_4H_{16}$) in place of VTMS, to obtain a deposited film. As shown in FIG. 11, the film thus obtained had a dielectric constant ranging from 2.5 to 3.3, which is higher than that of the deposited film obtained in Example 3.

EXAMPLE 4

Except that a mixture of tetramethylcyclotetrasiloxane (TMCTSO, $Si_4O_4C_4H_{16}$) and $C_2H_4$ (1:1) was used instead of VTMS, the procedure of Example 1 was repeated to obtain a deposited film, which was subsequently annealed.

Figure 14:
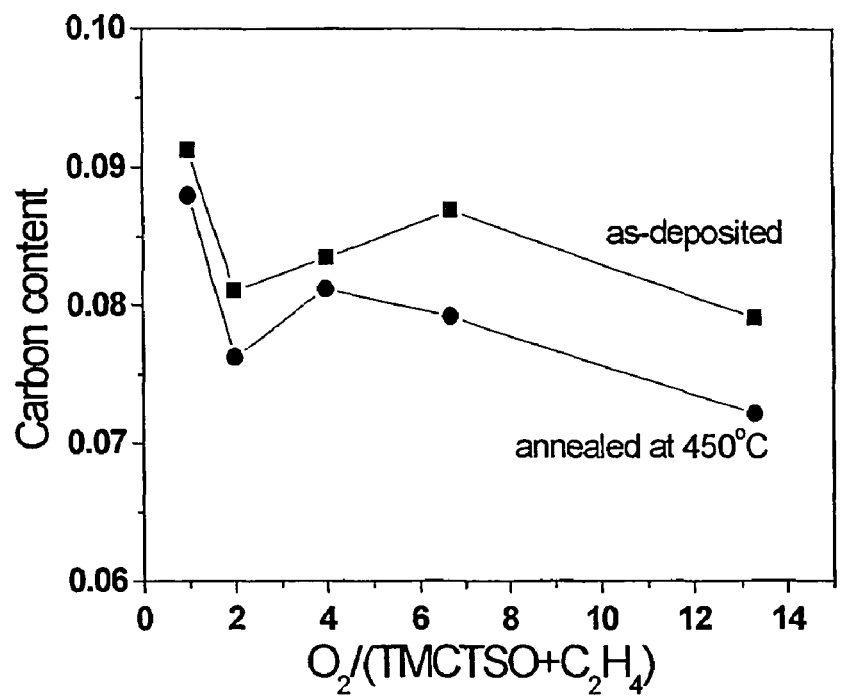
FIGS. 14 and 15: variations in carbon contents and dielectric constants of the film obtained in Example 4 of the present invention with $O_2$/(TMCTSO+$C_2H_4$) flow ratio, respectively.
Figure 15:
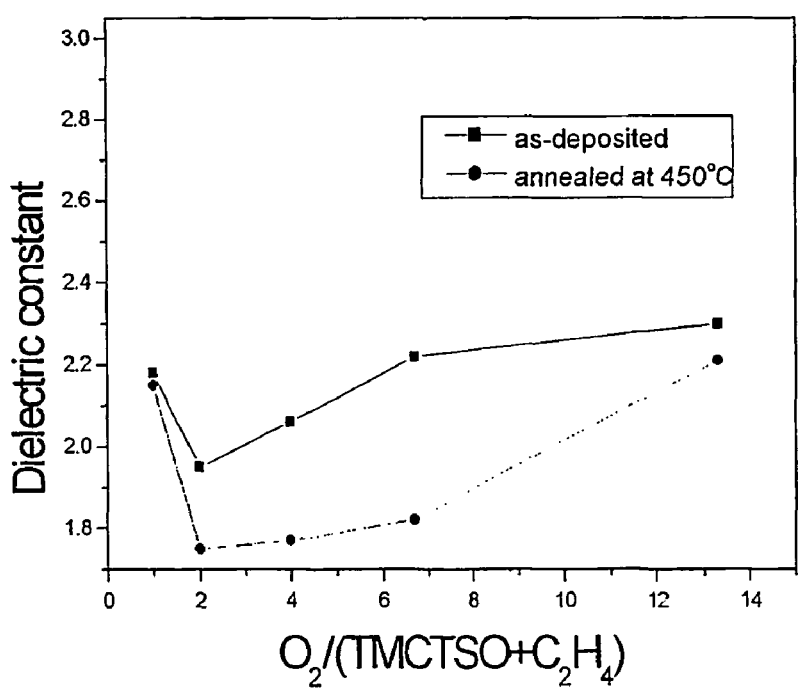
Figure 16:
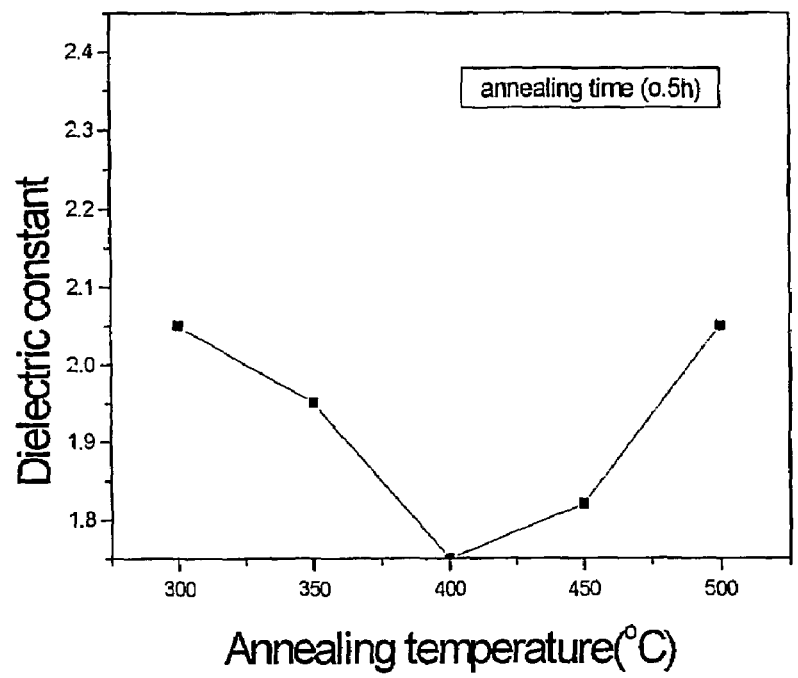
FIGS. 16 and 17: changes in the dielectric constant of the film obtained in Example 4 as function of annealing temperature and annealing time, respectively.
Figure 17:
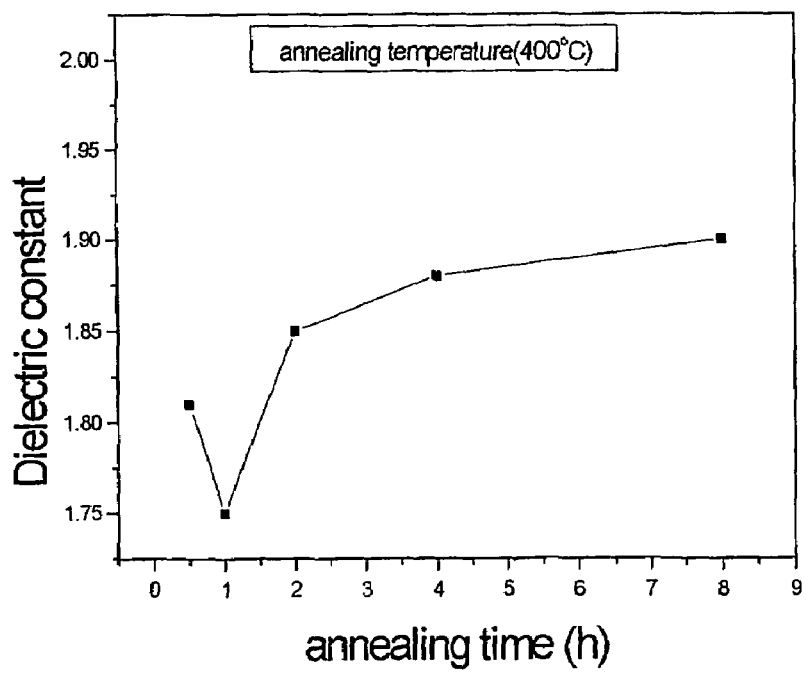

FIG. 14 and FIG. 15 depict the carbon contents and dielectric constants of the deposited film and the annealed film, respectively. The deposited film has a dielectric constant of 2.3 or below, and the film annealed at 450° C. has a dielectric constant of 2.2 or below. FIG. 16 and FIG. 17 show the effects of the annealing temperature (annealing time=0.5 hr) and annealing time (annealing temperature=400° C.) at the (TMCTSO+$C_2H_4$) flow ratio of 2 on the dielectric constant of the film, respectively. The film annealed at 300 to 500° C. for 0.5 hr has a dielectric constant of 2.05 or below.

EXAMPLE 5

The procedure of Example 1 was repeated using diallyldimethylsilane (DADMS, $SiC_8H_{16}$) in place of VTMS, to obtain a deposited film, which was subsequently annealed.

Figure 18:
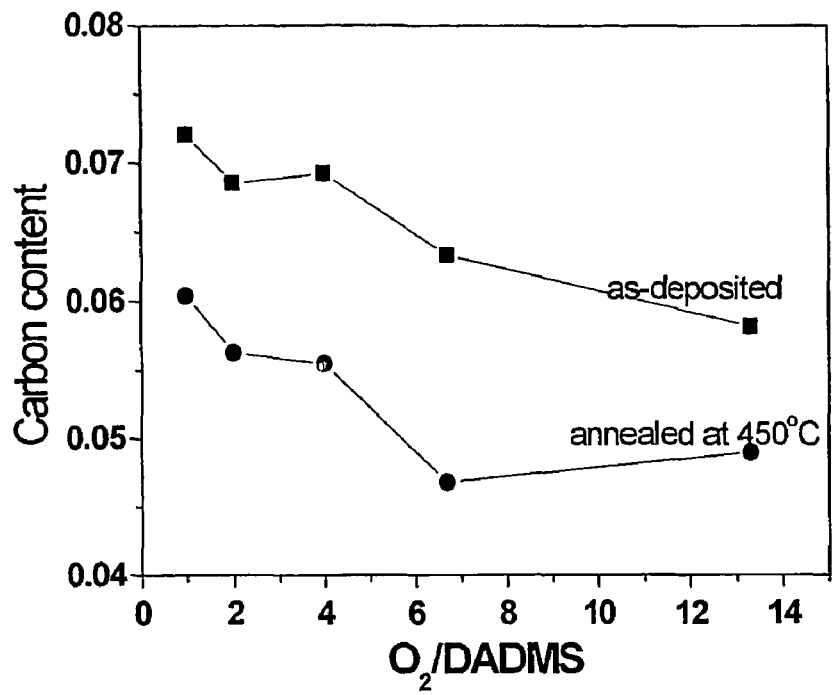
FIGS. 18 and 19: variations in carbon contents and dielectric constants of the film obtained in Example 5 of the present invention with $O_2$/DADMS flow ratio, respectively.
Figure 19:
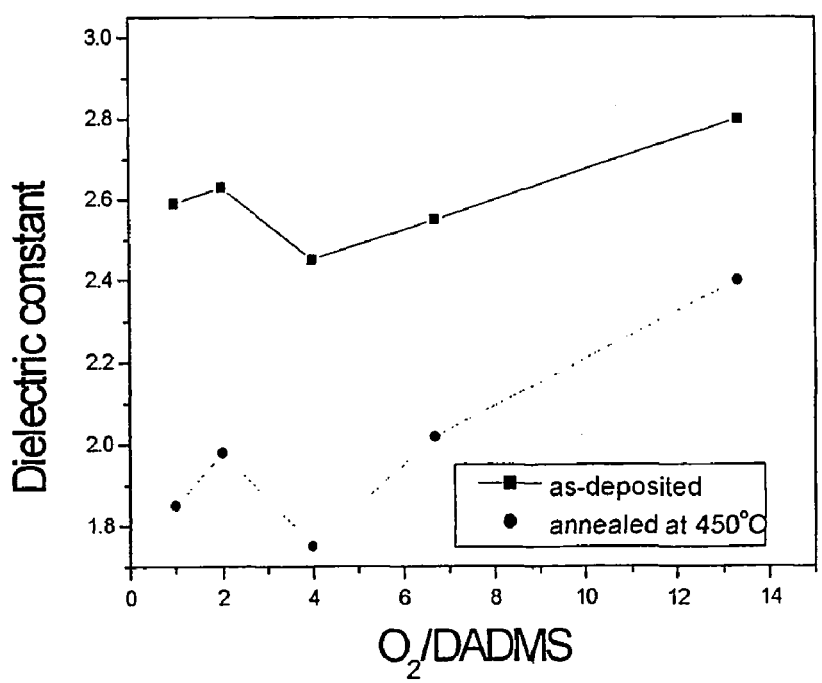
Figure 20:
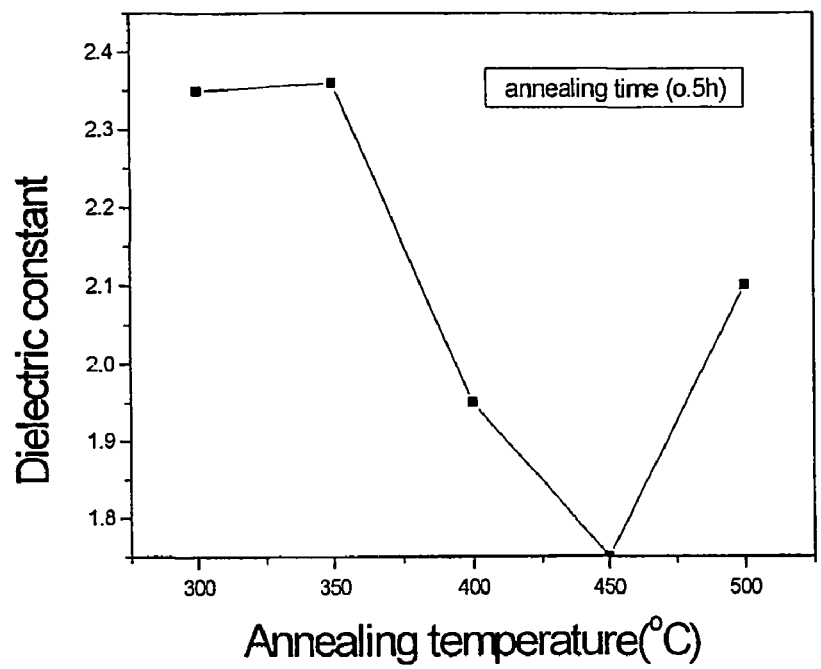
FIGS. 20 and 21: changes in the dielectric constant of the film obtained in Example 5 as function of annealing temperature and annealing time, respectively.
Figure 21:
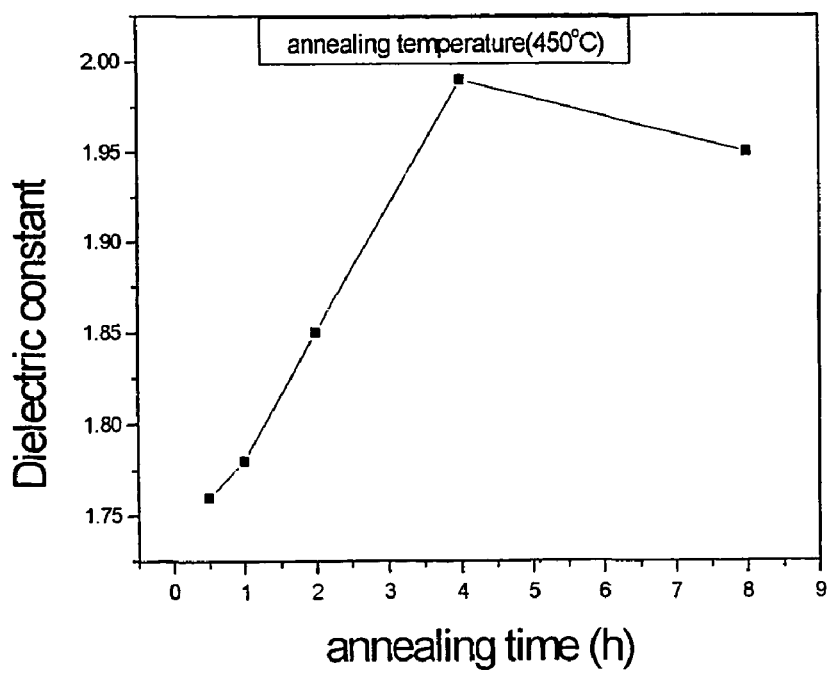

FIG. 18 and FIG. 19 show the carbon contents and dielectric constants of the deposited film and the annealed film, respectively. The deposited film has a dielectric constant of 2.8 or below, and the film annealed at 450° C., a dielectric constant of 2.4 or below. FIG. 20 and FIG. 21 show the effects of the annealing temperature (annealing time=0.5 hr) and annealing time (annealing temperature=450° C.) at the $O_2$/DADMS flow ratio of 4 on the dielectric constant of the film, respectively. The film annealed at 300 to 500° C. for 0.5 hr has a dielectric constant of 2.35 or below.

EXAMPLE 6

Except that 1,3-divinyltetramethyldisiloxane (DVTMDSO, $Si_2OC_8H_{18}$) was used in place of VTMS, the procedure of Example 1 was repeated to obtain a deposited film, which was subsequently annealed.

Figure 22:
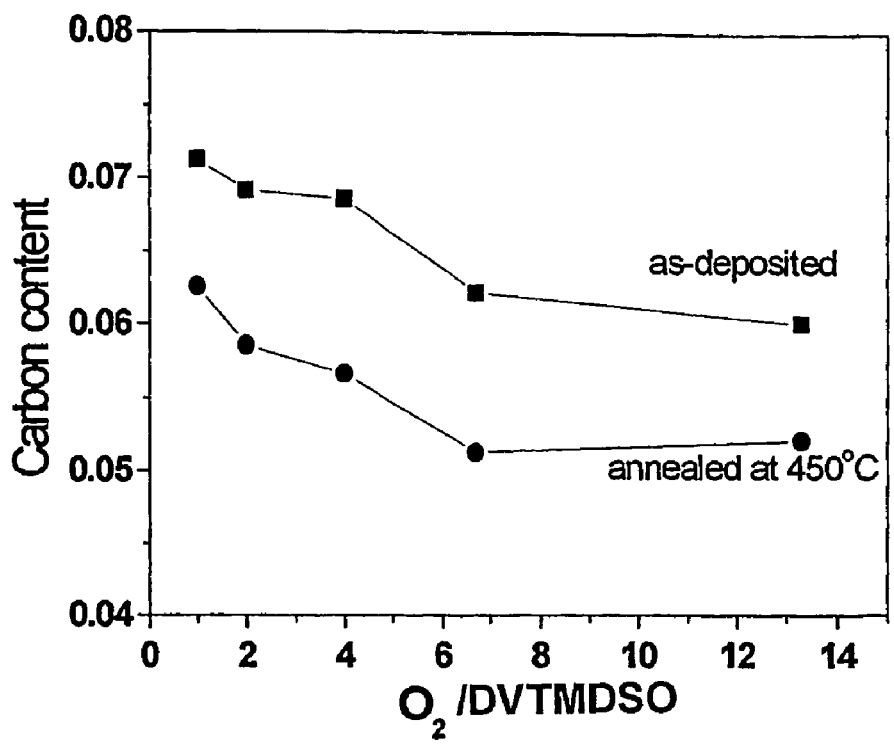
FIGS. 22 and 23: variations in carbon contents and dielectric constants of the film obtained in Example 6 of the present invention with $O_2$/DVTMDSO flow ratio, respectively.
Figure 23:
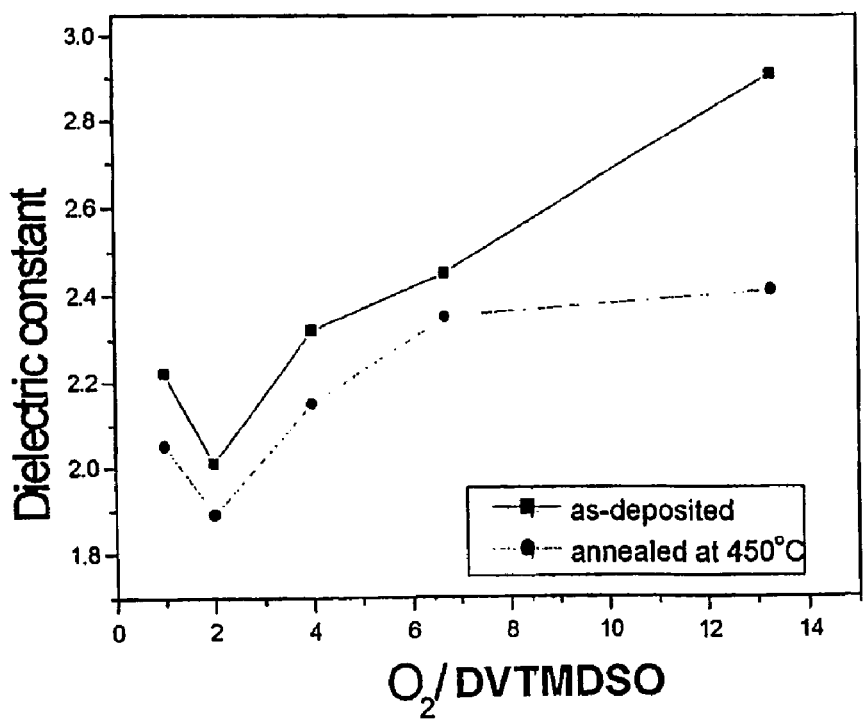
Figure 24:
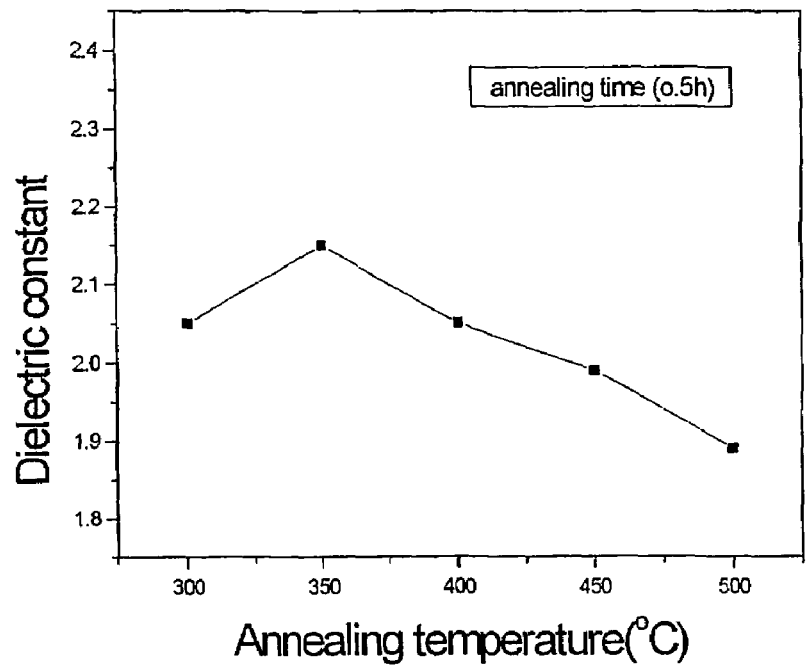
FIGS. 24 and 25: changes in the dielectric constant of the film obtained in Example 6 as function of annealing temperature and annealing time, respectively.
Figure 25:
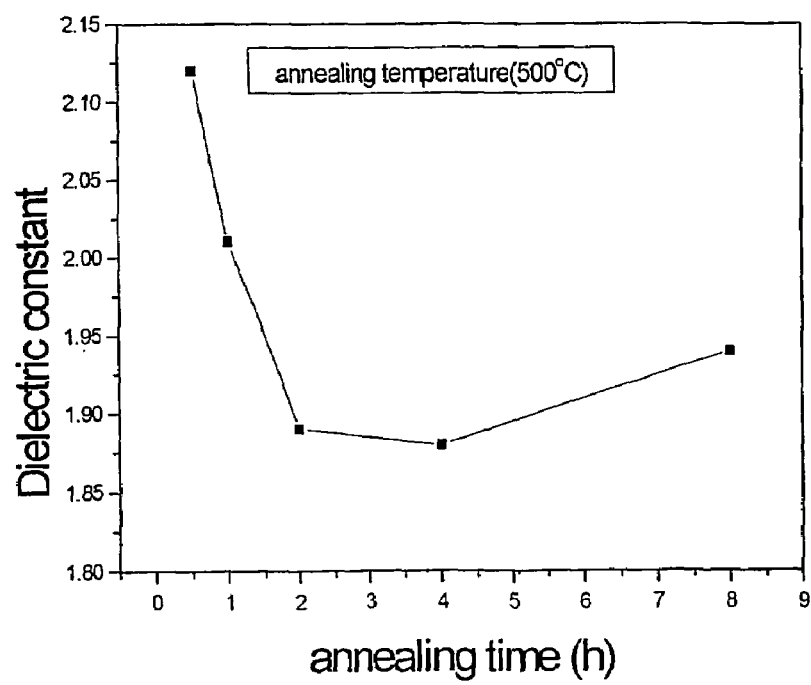

FIG. 22 and FIG. 23 show the carbon contents and dielectric constants of the deposited film and the annealed film, respectively. The deposited film has a dielectric constant of 2.9 or below, and the film annealed at 450° C. has a dielectric constant of 2.4 or below. FIG. 24 and FIG. 25 show the effects of the annealing temperature (annealing time=0.5 hr) and annealing time (annealing temperature=500° C.) at the $O_2$/DVTMDSO flow ratio of 2 on the dielectric constant of the film, respectively. The film annealed at 300 to 500° C. for 0.5 hr has a dielectric constant of 2.15 or below.

EXAMPLE 7

The procedure of Example 1 was repeated using vinyltrimethoxysilane (VTMOS, $SiO_3C_5H_{12}$) in place of VTMS, to obtain a deposited film, which was subsequently annealed.

Figure 26:
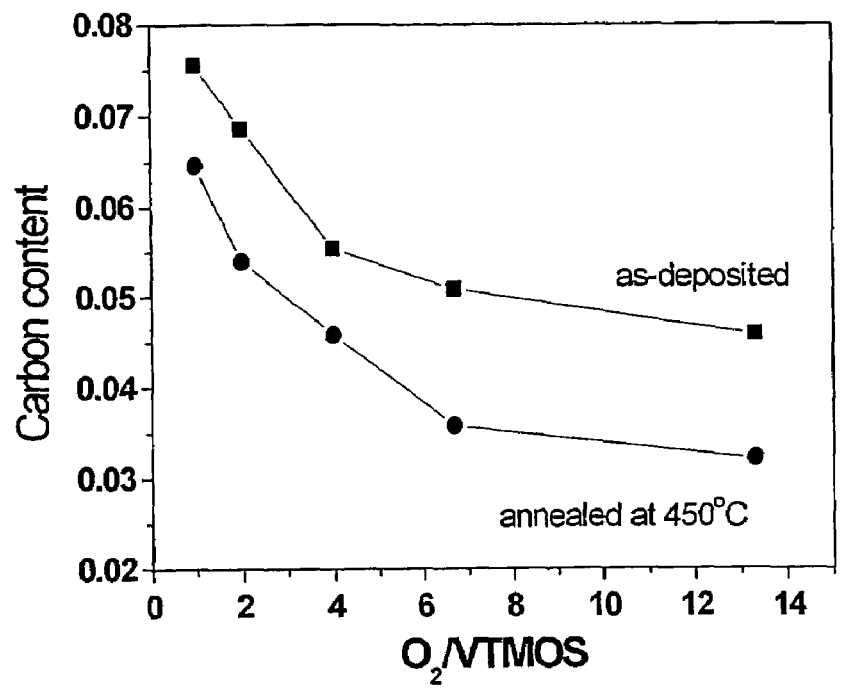
FIGS. 26 and 27: variations in carbon contents and dielectric constants of the film obtained in Example 7 of the present invention with $O_2$/VTMOS flow ratio, respectively.
Figure 27:
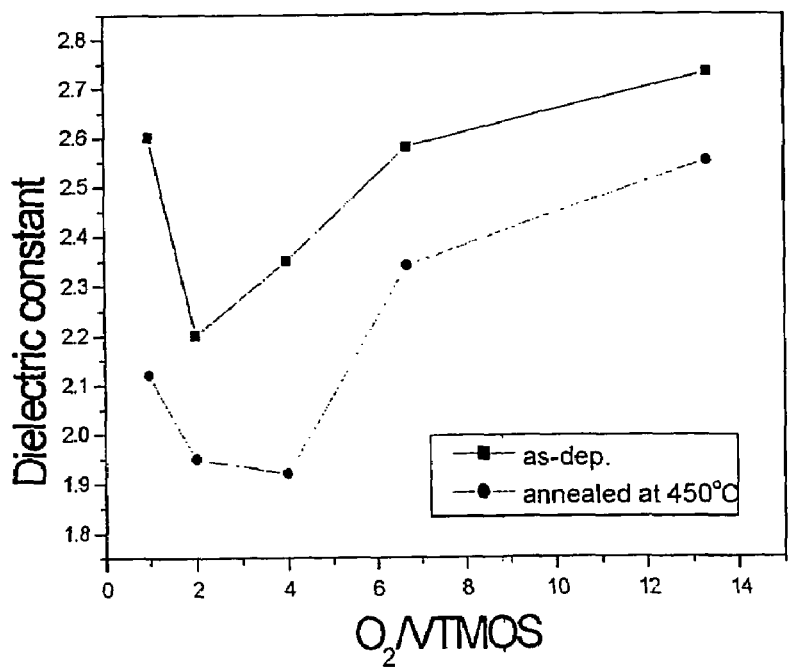
Figure 28:
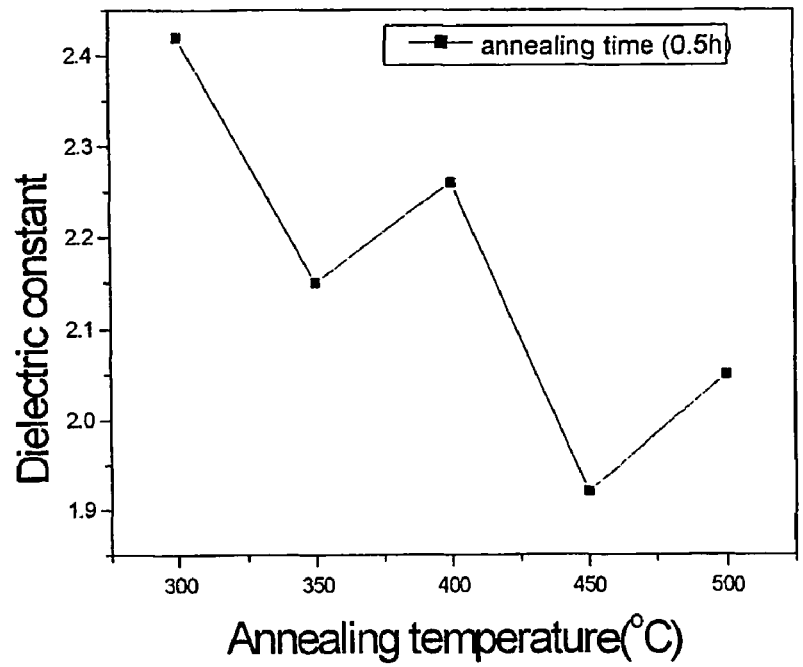
FIGS. 28 and 29: changes in the dielectric constant of the film obtained in Example 7 as function of annealing temperature and annealing time, respectively.
Figure 29:
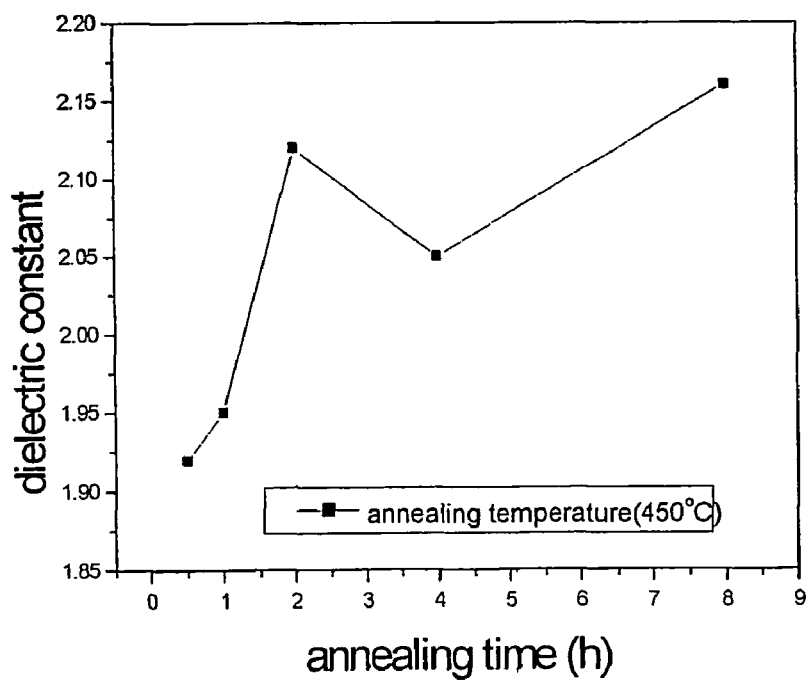

FIG. 26 and FIG. 27 show the carbon contents and dielectric constants of the deposited film and the annealed film, respectively. The deposited film has a dielectric constant in the range of 2.2 to 2.75, and the film annealed at 450° C. has a dielectric constant in the range of 1.9 to 2.55. FIG. 28 and FIG. 29 show the effects of the annealing temperature (annealing time=0.5 hr) and annealing time (annealing temperature=450° C.) at the $O_2$/VTMOS flow ratio of 2 on the dielectric constant of the film, respectively. The film annealed at 300 to 500° C. for 0.5 hr has a dielectric constant of 2.4 or below.

EXAMPLE 8

Except that ethinyltrimethylsilane (ETMS, $SiC_5H_{10}$) was used in place of VTMS, the procedure of Example 1 was repeated to obtain a deposited film, which was subsequently annealed.

Figure 30:
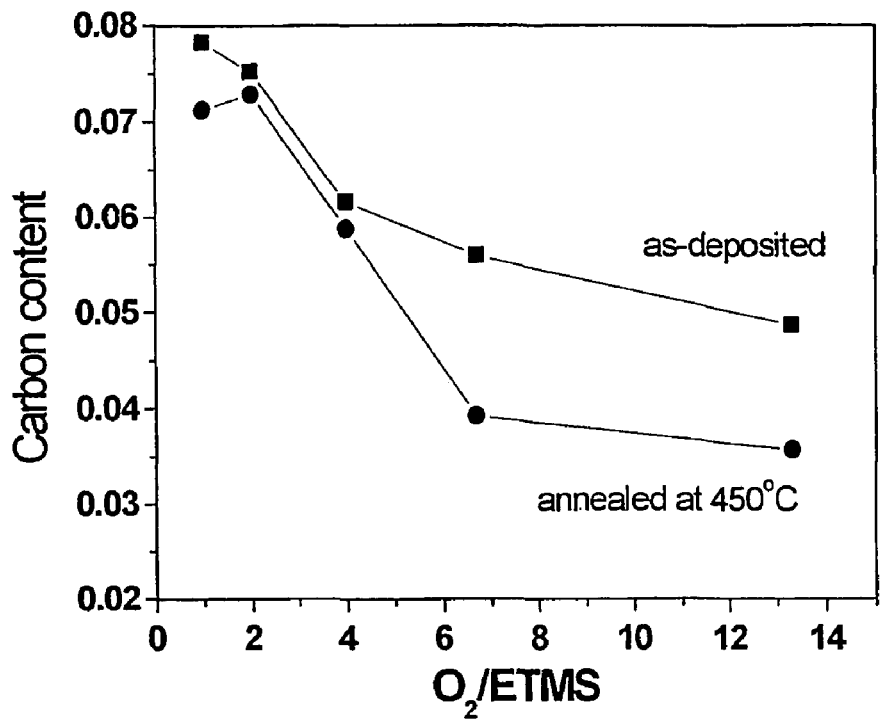
FIGS. 30 and 31: variations in carbon contents and dielectric constants of the film obtained in Example 8 of the present invention with $O_2$/ETMS flow ratio, respectively.
Figure 31:
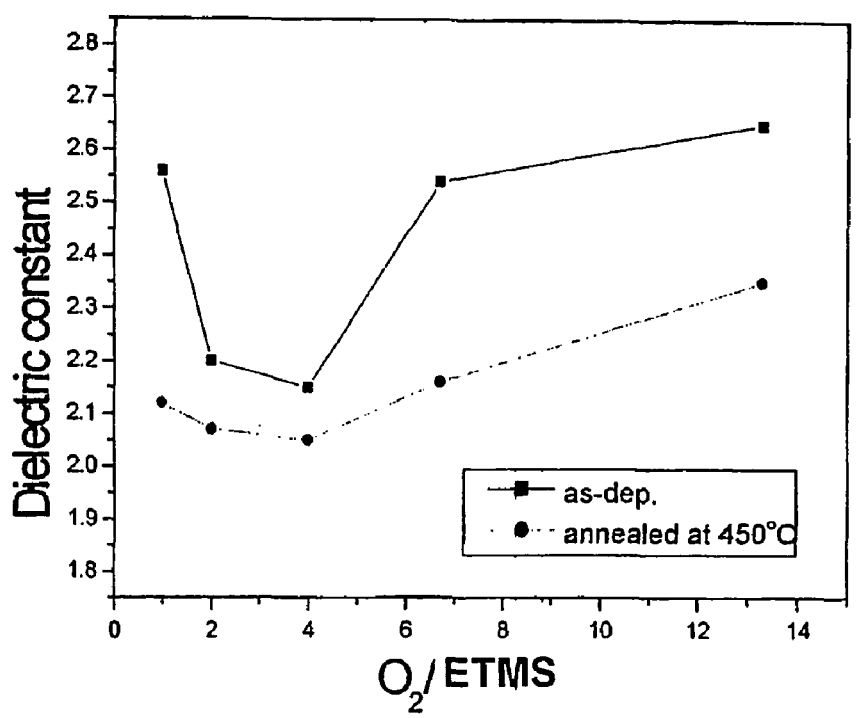
Figure 32:
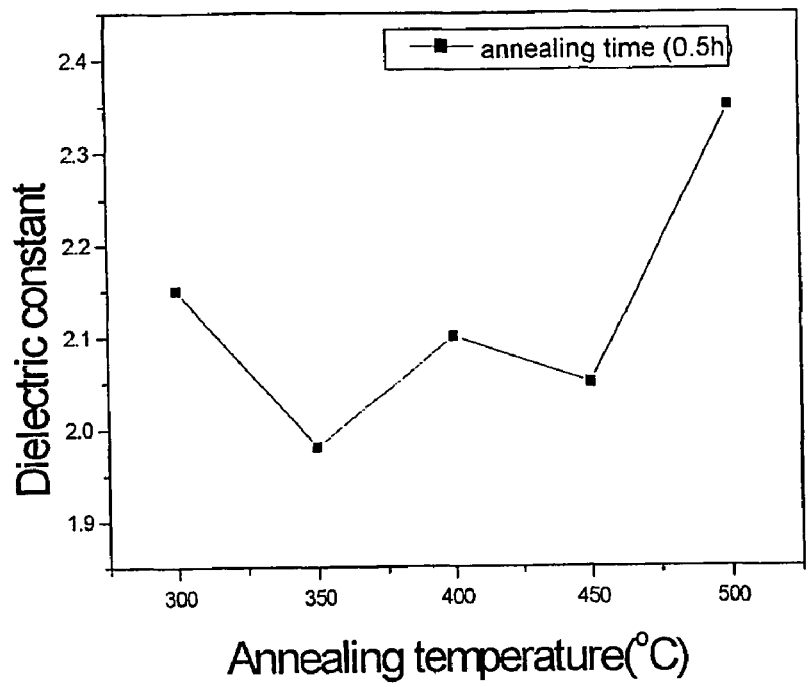
FIGS. 32 and 33: changes in the dielectric constant of the film obtained in Example 8 as function of annealing temperature and annealing time, respectively.
Figure 33:
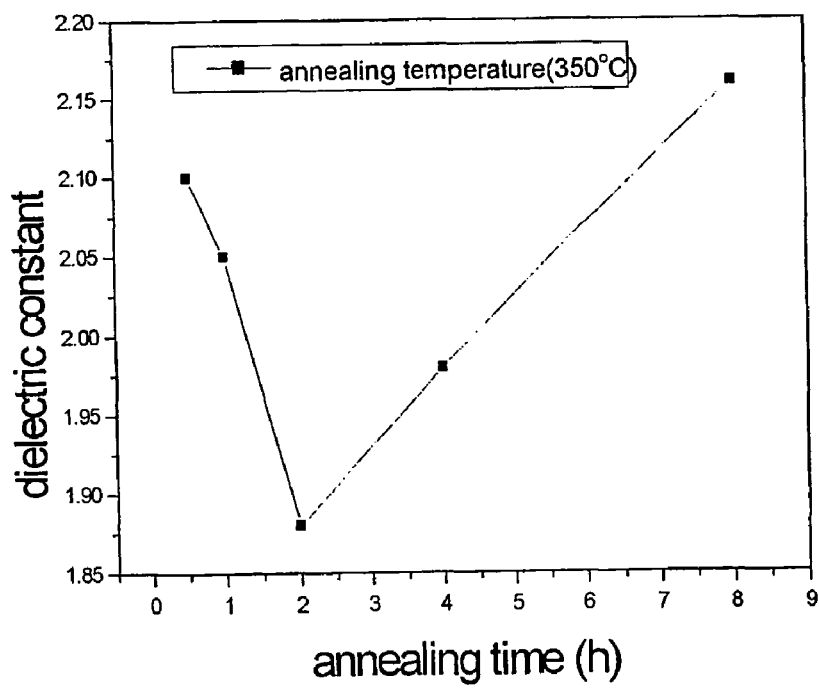

FIG. 30 and FIG. 31 show the carbon contents and dielectric constants of the deposited film and the annealed film, respectively. The deposited film has a dielectric constant of 2.65 or below, and the film annealed at 450° C., a dielectric constant of 2.35 or below. FIG. 32 and FIG. 33 show the effects of the annealing temperature (annealing time=0.5 hr) and annealing time (annealing temperature=350° C.) at the $O_2$/ETMS flow ratio of 4 on the dielectric constant of the film, respectively. The film annealed at 300 to 500° C. for 0.5 hr has a dielectric constant of 2.35 or below.

EXAMPLE 9

The procedure of Example 1 was repeated using a mixture of hexamethyldisiloxane (HMDSO, $Si_2OC_6H_{18}$) and $C_2H_4$ (1:2) in place of VTMS, to obtain a deposited film, which was subsequently annealed.

Figure 34:
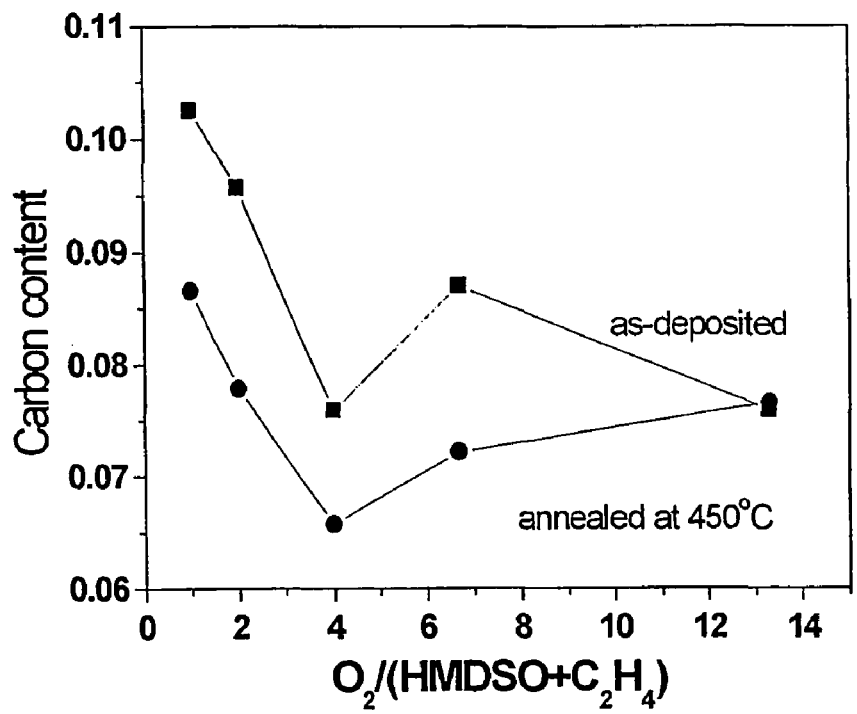
FIGS. 34 and 35: variations in carbon contents and dielectric constants of the films obtained in Example 9 of the present invention with $O_2$/(HMDSO+$C_2H_4$) flow ratio, respectively.
Figure 35:
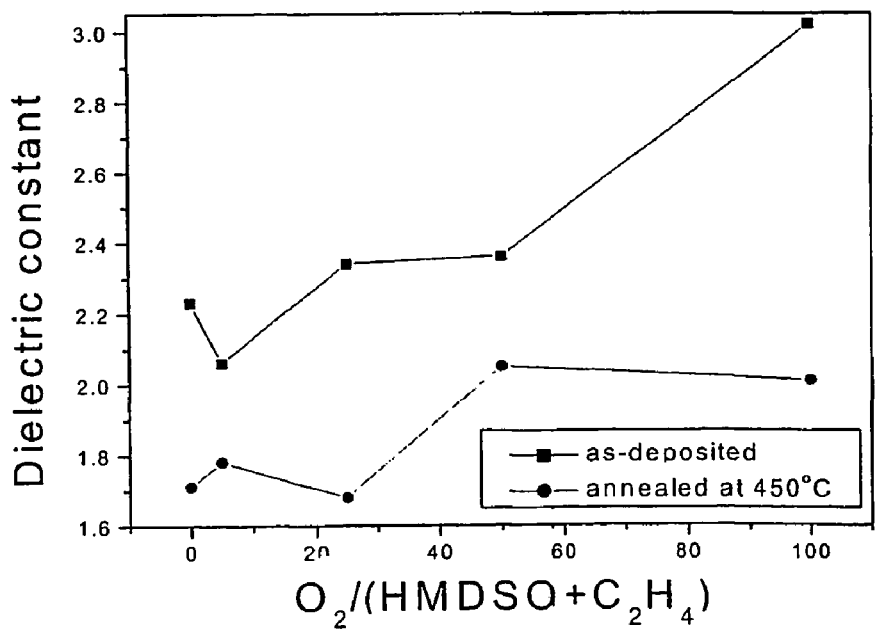
Figure 36:
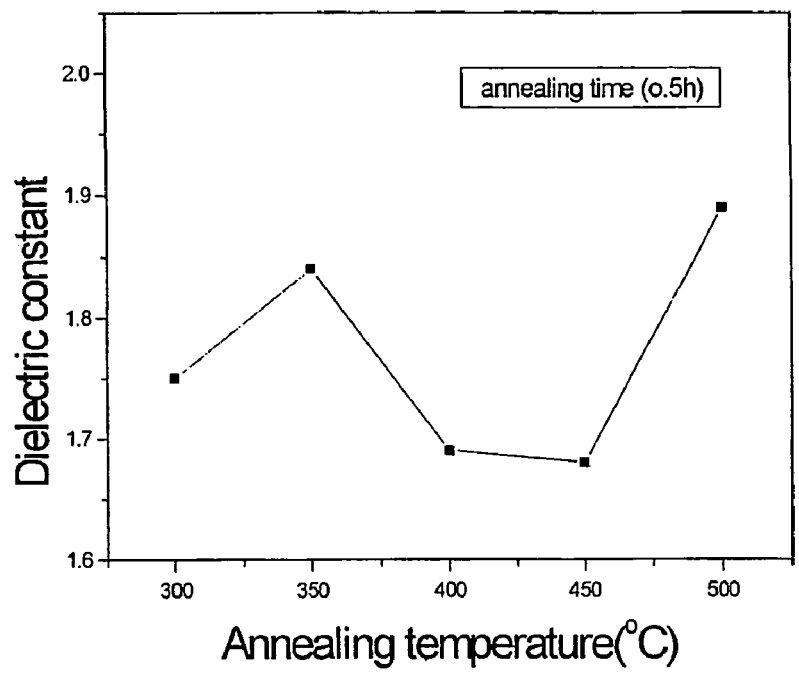
FIGS. 36 and 37: changes in the dielectric constant of the film obtained in Example 9 as function of annealing temperature and annealing time, respectively.
Figure 37:
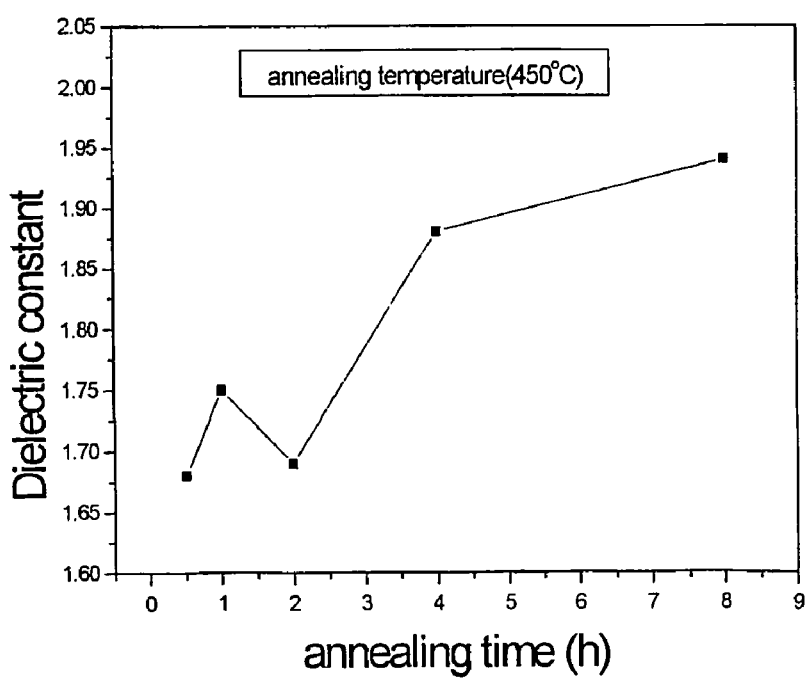

FIG. 34 and FIG. 35 show the carbon contents and dielectric constants of the deposited film and the annealed film, respectively. The deposited film has a dielectric constant of 3.0 or below, and the film annealed at 450° C., a dielectric constant of 2.05 or below. FIG. 36 and FIG. 37 show the effects of the annealing temperature (annealing time=0.5 hr) and annealing time (annealing temperature=450° C.) at the $O_2$/(HMDSO+$C_2H_4$) flow ratio of 4 on the dielectric constant of the film, respectively. The film annealed at 300 to 500° C. for 0.5 hr has a dielectric constant ranging from 1.7 to 1.9.

As can be seen from the above results, the low dielectric constant SiCOH film prepared by conducting CVD using an $O_2$-containing gas plasma and an unsaturated organosilicon or organosilicate compound, or a mixture of a saturated organosilicon or organosilicate compound and an unsaturated hydrocarbon in accordance with the present invention has a dielectric constant of 2.6 or below, which is exceptionally lower than conventional low k-materials.

While the subject invention have been described and illustrated with respect to the preferred embodiments only, various changes and modifications may be made therein without departing from the essential concept of the present invention which should be limited only by the scope of the appended claims.

What is claimed is:

1. A method for preparing a low dielectric constant hydrogenated silicon-oxycarbide (SiCO:H) film having a dielectric constant of less than about 2.8 which comprises conducting chemical vapor deposition using, together with an $O_2$-containing gas plasma, an alkylsilane containing at least one vinyl or ethynyl group.

2. The method of claim 1, wherein the alkylsilane containing at least one vinyl or ethynyl group is selected from the group consisting of vinyltrimethylsilane, vinyltriethylsilane, allyldimethylsilane, ethynyltrimethylsilane, ethynyltriethylsilane and a mixture thereof.

3. The method of claim 1, wherein the $O_2$-containing gas is selected from the group consisting of $O_2$, $N_2O$, $O_3$, $H_2O_2$, $CO_2$, $H_2O$ and a mixture thereof.

4. The method of claim 1 further comprising the step of annealing the deposited film at a temperature ranging from 100 to 500 °C for 0.5 to 8 hrs.

5. The method of claim 1, wherein the dielectric constant of the SiCO:H film is within the range of 2.3–2.8.

* * * * *